US012690401B2

(12) United States Patent
Suzuki

(10) Patent No.: US 12,690,401 B2
(45) Date of Patent: *Jul. 21, 2026

(54) ETCHING GAS, ETCHING METHOD, AND METHOD FOR PRODUCING SEMICONDUCTOR DEVICE

(71) Applicant: Resonac Corporation, Tokyo (JP)

(72) Inventor: Atsushi Suzuki, Tokyo (JP)

(73) Assignee: Resonac Corporation, Tokyo (JP)

( * ) Notice: Subject to any disclaimer, the term of this patent is extended or adjusted under 35 U.S.C. 154(b) by 231 days.

This patent is subject to a terminal disclaimer.

(21) Appl. No.: 18/031,816

(22) PCT Filed: Oct. 8, 2021

(86) PCT No.: PCT/JP2021/037422
§ 371 (c)(1),
(2) Date: Apr. 13, 2023

(87) PCT Pub. No.: WO2022/080268
PCT Pub. Date: Apr. 21, 2022

(65) Prior Publication Data
US 2023/0386850 A1      Nov. 30, 2023

(30) Foreign Application Priority Data

Oct. 15, 2020      (JP) ................................. 2020-173915

(51) Int. Cl.
H10P 50/24        (2026.01)
H10P 50/26        (2026.01)
H10P 50/28        (2026.01)
(52) U.S. Cl.
CPC .......... *H10P 50/242* (2026.01); *H10P 50/267* (2026.01); *H10P 50/283* (2026.01)

(58) Field of Classification Search
None
See application file for complete search history.

(56) References Cited

U.S. PATENT DOCUMENTS 10,457,866 B2     10/2019   Nakamura et al.
2010/0264116 A1   10/2010   Suzuki et al.
(Continued)

FOREIGN PATENT DOCUMENTS

CN        107533969 A      1/2018
JP        2011-136955 A    7/2011
(Continued)

OTHER PUBLICATIONS

International Search Report for PCT/JP2021/037422, dated Dec. 28, 2021.

*Primary Examiner* — Stephanie P Duclair
(74) *Attorney, Agent, or Firm* — Sughrue Mion, PLLC

(57)        ABSTRACT

An etching gas and an etching method capable of selectively etching an etching object containing silicon as compared with a non-etching object. The etching gas contains fluorobutene represented by a general formula $C_4H_xF_y$, in which x is 1 or more and 7 or less, y is 1 or more and 7 or less, and x+y is 8. The etching gas contains or does not contain at least one of copper, zinc, manganese, cobalt, and silicon as metal impurities, and the sum of the concentrations of copper, zinc, manganese, cobalt, and silicon when contained is 5000 ppb by mass or less. The etching method includes an etching step of bringing the etching gas into contact with a member to be etched (12) having an etching object and a non-etching object, and selectively etching the etching object as compared with the non-etching object. The etching object contains silicon.

18 Claims, 1 Drawing Sheet

(56)  References Cited

U.S. PATENT DOCUMENTS

2015/0294880 A1* 10/2015 Anderson ......... H01L 21/31116
438/719
2018/0066187 A1    3/2018 Nakamura et al.
2019/0105588 A1    4/2019 Hyakutake et al.
2020/0234962 A1    7/2020 Kato et al.

FOREIGN PATENT DOCUMENTS

JP      2014-185111  A       10/2014
JP      2015-533029  A       11/2015
JP      2017092357   A   *   5/2017
JP      6527214      B2      6/2019
TW      200926294    A       6/2009
TW      201422780    A       6/2014
WO      2017/169809  A1      10/2017

* cited by examiner

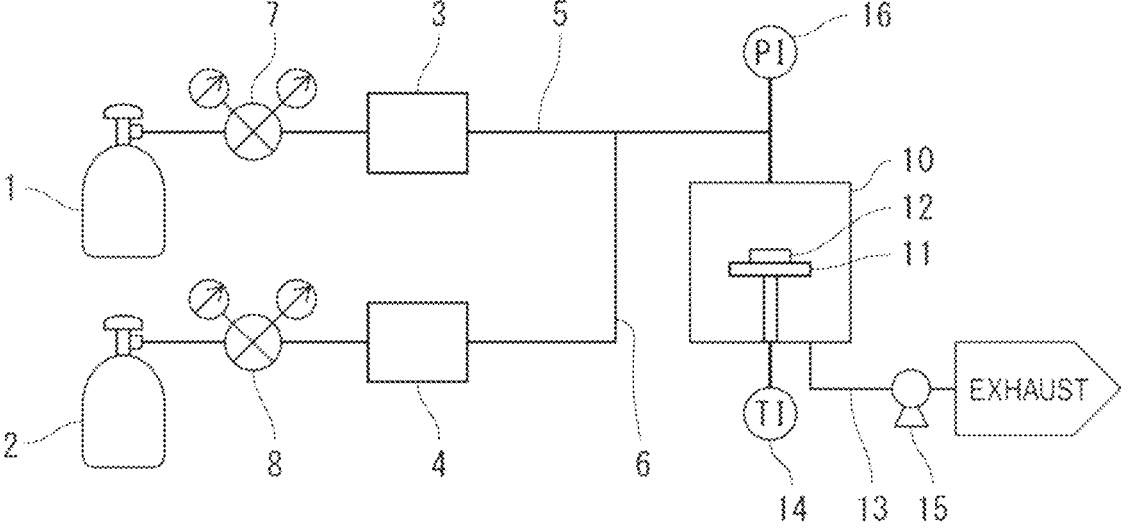

ETCHING GAS, ETCHING METHOD, AND METHOD FOR PRODUCING SEMICONDUCTOR DEVICE

CROSS REFERENCE TO RELATED APPLICATIONS

This application is a National Stage of International Application No. PCT/JP2021/037422 filed Oct. 8, 2021, claiming priority based on Japanese Patent Application No. 2020-173915 filed Oct. 15, 2020.

TECHNICAL FIELD

The present invention relates to an etching gas, an etching method, and a method for producing a semiconductor device.

BACKGROUND ART

In a semiconductor production step, dry etching is used for patterning or removal of silicon compounds, such as silicon oxides and silicon nitrides. The dry etching is required to have high etching selectivity. More specifically, the dry etching is required to be able to selectively etch the silicon compounds as compared with a mask used for patterning.

Various etching gases satisfying this requirement have been proposed. PTL 1, for example, discloses an etching gas containing hexafluoroisobutene. Hexafluoroisobutene reacts and forms a polymer during etching, and a film of the polymer covers and protects a mask, and therefore high etching selectivity can be easily obtained.

CITATION LIST

Patent Literature

PTL 1: JP 6527214 B

SUMMARY OF INVENTION

Technical Problem

However, etching using the etching gas disclosed in PTL 1 has sometimes resulted in insufficient etching selectivity.

It is an object of the present invention to provide an etching gas capable of selectively etching an etching object which is an object to be etched by the etching gas as compared with a non-etching object which is not an object to be etched by the etching gas when the etching is performed by bringing the etching gas into contact with a member to be etched having the etching object and the non-etching object, an etching method, and a method for producing a semiconductor device.

Solution to Problem

To achieve the above-described object, one aspect of the present invention is as described in [1] to [9] below.

[1] An etching gas contains: fluorobutene represented by a general formula $C_4H_xF_y$, in which x is 1 or more and 7 or less, y is 1 or more and 7 or less, and x+y is 8, in which the etching gas contains or does not contain at least one of copper, zinc, manganese, cobalt, and silicon as metal impurities, and the sum of the concentrations of copper, zinc, manganese, cobalt, and silicon when contained is 5000 ppb by mass or less.

[2] The etching gas according to [1], further contains or does not contain at least one of alkali metals and alkaline earth metals as the metal impurities, and the total sum of the concentrations of copper, zinc, manganese, cobalt, and silicon, and alkali metals and alkaline earth metals when contained is 10000 ppb by mass or less.

[3] The etching gas according to [2], in which the alkali metal is at least one of lithium, sodium, and potassium, and the alkaline earth metal is at least one of magnesium and calcium.

[4] The etching gas according to any one of [1] to [3], in which the fluorobutene is at least one selected from 1,1,1,4,4,4-hexafluoro-2-butene, 1,1,1,2,4,4,4-heptafluoro-2-butene, 3,3,4,4,4-pentafluoro-1-butene, and 2,3,3,4,4,4-hexafluoro-1-butene.

[5] An etching method includes: an etching step of bringing the etching gas according to any one of [1] to [4] into contact with a member to be etched having an etching object which is an object to be etched by the etching gas and a non-etching object which is not an object to be etched by the etching gas, and selectively etching the etching object as compared with the non-etching object, in which the etching object contains silicon.

[6] The etching method according to [5], includes, before the etching step, a metal impurity removing step of setting the sum of the concentrations of copper, zinc, manganese, cobalt, and silicon contained in the etching gas to 5000 ppb by mass or less.

[7] The etching method according to [5] or [6], in which the etching gas is a gas containing only the fluorobutene or a mixed gas containing the fluorobutene and a dilution gas.

[8] The etching method according to [7], in which the dilution gas is at least one selected from a nitrogen gas, helium, argon, neon, krypton, and xenon.

[9] A method for producing a semiconductor device using the etching method according to any one of [5] to [8], the member to be etched being a semiconductor substrate having the etching object and the non-etching object, and the method includes:

a treatment step of removing at least a part of the etching object from the semiconductor substrate by the etching.

Advantageous Effects of Invention

According to the present invention, the etching object containing silicon can be selectively etched as compared with the non-etching object.

BRIEF DESCRIPTION OF DRAWINGS

The FIGURE is a schematic view of one example of an etching system for explaining one embodiment of an etching method according to the present invention.

DESCRIPTION OF EMBODIMENTS

Hereinafter, one embodiment of the present invention will be described. This embodiment describes one example of the present invention, and the present invention is not limited to this embodiment. Further, this embodiment can be variously altered or modified and embodiments obtained by such alternations or modifications may also be included in the present invention.

An etching gas according to this embodiment is an etching gas containing fluorobutene represented by a general formula $C_4H_xF_y$, in which x is 1 or more and 7 or less, y is 1 or more and 7 or less, and x+y is 8, and the etching gas contains or does not contain at least one of copper (Cu), zinc (Zn), manganese (Mn), cobalt (Co), and silicon (Si) as metal impurities, and the sum of the concentrations of copper, zinc, manganese, cobalt, and silicon when contained is 5000 ppb by mass or less.

An etching method according to this embodiment includes an etching step of bringing the etching gas according to this embodiment into contact with a member to be etched having an etching object which is an object to be etched by the etching gas and a non-etching object which is not an object to be etched by the etching gas, and selectively etching the etching object as compared with the non-etching object. In the etching method according to this embodiment, the etching object contains silicon (Si).

When the etching gas is brought into contact with the member to be etched, the etching object containing silicon reacts with the fluorobutene above in the etching gas, and therefore the etching of the etching object proceeds. On the other hand, the non-etching object, such as a mask, hardly reacts with the fluorobutene above, and therefore the etching of the non-etching objects hardly proceeds. Therefore, according to the etching method of this embodiment, the etching object can be selectively etched as compared with the non-etching object (i.e., high etching selectivity is obtained).

Further, the fluorobutene above reacts and forms a polymer during dry etching, and the non-etching object is coated with a film of this polymer to be protected from the etching. Therefore, the etching of the non-etching object becomes more difficult to proceed, and therefore the etching selectivity is further increased when the etching is performed using the etching gas containing the fluorobutene above.

However, when the etching gas contains the metal impurities, the catalytic action of the metal impurities causes dissociation of a carbon-carbon double bond of the fluorobutene above, thereby suppressing the formation of the polymer film. As a result, the non-etching object is difficult to be protected by the polymer film, and the etching of the non-etching object easily proceeds, which poses a risk of a reduction in the etching selectivity. Copper, zinc, manganese, cobalt, and silicon have a high catalytic action of causing the dissociation of the carbon-carbon double bond of the fluorobutene above, and thus have a risk of greatly reducing the etching selectivity.

The etching gas according to this embodiment does not contain copper, zinc, manganese, cobalt, and silicon or, even when the etching gas according to this embodiment contains copper, zinc, manganese, cobalt, and silicon, the concentrations thereof are low, and therefore the dissociation of the carbon-carbon double bond of the fluorobutene above is difficult to occur. Therefore, when the dry etching of the member to be etched is performed using the etching gas according to this embodiment, the formation of the polymer film on the non-etching object is difficult to be suppressed, and therefore the etching object can be selectively etched as compared with the non-etching object.

For example, an etching selectivity ratio, which is a ratio of the etching rate of the etching object to the etching rate of the non-etching object, tends to be 10 or more. The etching selectivity ratio is preferably 10 or more, more preferably 30 or more, and still more preferably 50 or more.

In the technology disclosed in PTL 1, the concentrations of copper, zinc, manganese, cobalt, and silicon in the etching gas are not considered, and therefore when etching is performed using the etching gas disclosed in PTL 1, copper, zinc, manganese, cobalt, and silicon has caused the dissociation of the carbon-carbon double bond of hexafluoroisobutene, which has suppressed the formation of the polymer film in some cases. As a result, the non-etching object has been difficult to be protected by the polymer film, so that the etching of the non-etching object has easily proceeded, and therefore the etching selectivity has decreased in some cases.

The etching in the present invention means processing the member to be etched into a predetermined shape (for example, three-dimensional shape) by partially or entirely removing the etching object possessed by the member to be etched (for example, processing the etching object in a film shape containing a silicon compound possessed by the member to be etched to have a predetermined film thickness).

The etching method according to this embodiment can be utilized for producing semiconductor devices. More specifically, the method for producing a semiconductor device according to this embodiment is a method for producing a semiconductor device using the etching method according to this embodiment. The member to be etched is a semiconductor substrate having the etching object and the non-etching object. The method includes a treatment step of removing at least a part of the etching object from the semiconductor substrate by etching.

The etching method according to this embodiment can accurately etch the etching object, and therefore is usable for producing semiconductor devices, such as 3D-NAND flash memories and logic devices. Further, the etching method according to this embodiment can be expected to contribute to further miniaturization and higher integration of semiconductor devices.

Hereinafter, the etching gas, the etching method, and the method for producing a semiconductor device according to this embodiment are described in more detail.

[Etching Method]

The etching in this embodiment can be achieved by either plasma etching using plasma or plasma-less etching not using plasma. Examples of the plasma etching include Reactive Ion Etching (RIE), Inductively Coupled Plasma (ICP) etching, Capacitively Coupled Plasma (CCP) etching, Electron Cyclotron Resonance (ECR) plasma etching, and microwave plasma etching, for example.

In the plasma etching, the plasma may be generated in a chamber where the member to be etched is installed, or a plasma generation chamber and the chamber where the member to be etched is installed may be separated (i.e., remote plasma may be used). By the etching using the remote plasma, the etching object containing silicon can be etched with higher selectivity in some cases.

[Fluorobutene]

Fluorobutene contained in the etching gas according to this embodiment is represented by a general formula $C_4H_xF_y$, and satisfies the following three conditions: x is 1 or more and 7 or less, y is 1 or more and 7 or less, and x+y is 8 in the general formula. The type of the fluorobutene is not particularly limited insofar as the above-described requirements are satisfied, and both linear fluorobutene and branched fluorobutene (isobutene) are usable, and fluoro-1-butene and the like and fluoro-2-butene and the like are preferably usable.

Specific examples of fluoro-1-butene include $CHF_2$—$CF_2$—$CF=CF_2$, $CF_3$—$CF_2$—$CF=CHF$, $CF_3$—$CHF$—$CF=CF_2$, $CF_3$—$CF_2$—$CH=CF_2$, $CHF_2$—$CHF$—

$CF\!=\!CF_2$, $CHF_2\!-\!CF_2\!-\!CF\!=\!CHF$, $CF_3\!-\!CHF\!-\!CF\!=\!CHF$, $CF_3\!-\!CF_2\!-\!CH\!=\!CHF$, $CF_3\!-\!CHF\!-\!CH\!=\!CF_2$, $CHF_2\!-\!CF_2\!-\!CH\!=\!CF_2$, $CH_3\!-\!CF_2\!-\!CF\!=\!CF_2$, $CH_2F\!-\!CHF\!-\!CF\!=\!CF_2$, $CH_2F\!-\!CF_2\!-\!CH\!=\!CF_2$, $CH_2F\!-\!CF_2\!-\!CF\!=\!CHF$, $CHF_2\!-\!CH_2\!-\!CF\!=\!CF_2$, $CHF_2\!-\!CHF\!-\!CH\!=\!CF_2$, $CHF_2\!-\!CHF\!-\!CF\!=\!CHF$, $CHF_2\!-\!CF_2\!-\!CH\!=\!CHF$, $CHF_2\!-\!CF_2\!-\!CF\!=\!CH_2$, $CF_3\!-\!CH_2\!-\!CH\!=\!CF_2$, $CF_3\!-\!CH_2\!-\!CF\!=\!CHF$, $CF_3\!-\!CHF\!-\!CH\!=\!CHF$, $CF_3\!-\!CHF\!-\!CF\!=\!CH_2$, $CF_3\!-\!CF_2\!-\!CH\!=\!CH_2$, $CH_3\!-\!CHF\!-\!CF\!=\!CF_2$, $CH_3\!-\!CF_2\!-\!CH\!=\!CF_2$, $CH_3\!-\!CF_2\!-\!CF\!=\!CHF$, $CH_2F\!-\!CH_2\!-\!CF\!=\!CF_2$, $CH_2F\!-\!CHF\!-\!CH\!=\!CF_2$, $CH_2F\!-\!CHF\!-\!CF\!=\!CHF$, $CH_2F\!-\!CF_2\!-\!CH\!=\!CHF$, $CH_2F\!-\!CF_2\!-\!CF\!=\!CH_2$, $CHF_2\!-\!CH_2\!-\!CH\!=\!CF_2$, $CHF_2\!-\!CH_2\!-\!CF\!=\!CHF$, $CHF_2\!-\!CHF\!-\!CF\!=\!CH_2$, $CHF_2\!-\!CF_2\!-\!CH\!=\!CH_2$, $CF_3\!-\!CH_2\!-\!CH\!=\!CHF$, $CF_3\!-\!CH_2\!-\!CF\!=\!CH_2$, $CF_3\!-\!CHF\!-\!CH\!=\!CH_2$, $CH_3\!-\!CH_2\!-\!CF\!=\!CF_2$, $CH_3\!-\!CHF\!-\!CH\!=\!CF_2$, $CH_3\!-\!CHF\!-\!CF\!=\!CHF$, $CH_3\!-\!CF_2\!-\!CH\!=\!CHF$, $CH_3\!-\!CF_2\!-\!CF\!=\!CH_2$, $CH_2F\!-\!CH_2\!-\!CF\!=\!CHF$, $CH_2F\!-\!CH_2\!-\!CF\!=\!CHF$, $CH_2F\!-\!CHF\!-\!CH\!=\!CHF$, $CH_2F\!-\!CHF\!-\!CF\!=\!CH_2$, $CH_2F\!-\!CF_2\!-\!CH\!=\!CH_2$, $CHF_2\!-\!CH_2\!-\!CH\!=\!CHF$, $CHF_2\!-\!CH_2\!-\!CF\!=\!CH_2$, $CHF_2\!-\!CHF\!-\!CH\!=\!CH_2$, $CF_3\!-\!CH_2\!-\!CH\!=\!CH_2$, $CH_3\!-\!CH_2\!-\!CH\!=\!CF_2$, $CH_3\!-\!CH_2\!-\!CF\!=\!CHF$, $CH_3\!-\!CHF\!-\!CH\!=\!CHF$, $CH_3\!-\!CHF\!-\!CF\!=\!CH_2$, $CH_3\!-\!CF_2\!-\!CH\!=\!CH_2$, $CH_2F\!-\!CH_2\!-\!CH\!=\!CHF$, $CH_2F\!-\!CH_2\!-\!CF\!=\!CH_2$, $CH_2F\!-\!CHF\!-\!CH\!=\!CH_2$, $CHF_2\!-\!CH_2\!-\!CH\!=\!CH_2$, $CH_3\!-\!CH_2\!-\!CH\!=\!CHF$, $CH_3\!-\!CH_2\!-\!CF\!=\!CH_2$, $CH_3\!-\!CHF\!-\!CH\!=\!CH_2$, $CH\!=\!CH_2$, and $CH_2F\!-\!CH_2\!-\!CH\!=\!CH_2$.

Specific examples of fluoro-2-butene include $CHF_2\!-\!CF\!=\!CF\!-\!CF_3$, $CF_3\!-\!CH\!=\!CF\!-\!CF_3$, $CH_2F\!-\!CF\!=\!CF\!-\!CF_3$, $CHF_2\!-\!CH\!=\!CF\!-\!CF_3$, $CHF_2\!-\!CF\!=\!CF\!-\!CHF_2$, $CF_3\!-\!CH\!=\!CH\!-\!CF_3$, $CH_3\!-\!CF\!=\!CF\!-\!CF_3$, $CH_2F\!-\!CH\!=\!CF\!-\!CF_3$, $CH_2F\!-\!CF\!=\!CH\!-\!CF_3$, $CH_2F\!-\!CF\!=\!CF\!-\!CHF_2$, $CHF_2\!-\!CH\!=\!CH\!-\!CF_3$, $CHF_2\!-\!CF\!=\!CH\!-\!CHF_2$, $CF\!=\!CH\!-\!CHF_2$, $CH_3\!-\!CH\!=\!CF\!-\!CF_3$, $CH_3\!-\!CF\!=\!CH\!-\!CF_3$, $CF\!=\!CH\!-\!CF_3$, $CH_3\!-\!CF\!=\!CF\!-\!CHF_2$, $CH_2F\!-\!CH\!=\!CH\!-\!CF_3$, $CH_2F\!-\!CH\!=\!CF\!-\!CHF_2$, $CF\!=\!CH\!-\!CHF_2$, $CH_2F\!-\!CF\!=\!CF\!-\!CH_2F$, $CHF_2\!-\!CH\!=\!CH\!-\!CHF_2$, $CH\!=\!CH\!-\!CHF_2$, $CH_3\!-\!CH\!=\!CH\!-\!CF_3$, $CH_3\!-\!CH\!=\!CF\!-\!CHF_2$, $CH_3\!-\!CF\!=\!CH\!-\!CHF_2$, $CF\!=\!CF\!-\!CH_2F$, $CH_2F\!-\!CF\!=\!CH\!-\!CH_2F$, $CH_2F\!-\!CH\!=\!CH\!-\!CHF_2$, $CH_3\!-\!CH\!=\!CH\!-\!CHF_2$, $CH\!=\!CF\!-\!CH_2F$, $CH_3\!-\!CF\!=\!CH\!-\!CH_2F$, $CF\!=\!CF\!-\!CH_3$, $CH_2F\!-\!CH\!=\!CH\!-\!CH_2F$, $CH\!=\!CH\!-\!CH_2F$, and $CH_3\!-\!CH\!=\!CF\!-\!CH_3$.

These fluorobutenes may be used alone or in combination of two or more types. Some of the fluorobutenes above have cis-trans isomers, but both the cis-type and trans-type fluorobutenes are usable for the etching gas according to this embodiment.

Among the fluorobutenes above, those having a boiling point at 1 atm of 50° C. or less are preferable, and those having a boiling point at 1 atm of 40° C. or less are more preferable. When the boiling point at 1 atm is within the ranges above, a gas of the fluorobutene is difficult to be liquefied inside a pipe or the like introducing the gas of the fluorobutene when the gas of the fluorobutene is introduced into, for example, a plasma etching system. Therefore, the occurrence of faults due to the liquefaction of the gas of the fluorobutene can be suppressed, so that the plasma etching treatment can be efficiently performed.

From the above-described viewpoint, fluorobutene is preferably at least one selected from 1,1,1,4,4,4-hexafluoro-2-butene (boiling point of 9° C.), 1,1,1,2,4,4,4-heptafluoro-2-butene (boiling point of 8° C.), 3,3,4,4,4-pentafluoro-1-butene (boiling point of 3 to 6° C.), and 2,3,3,4,4,4-hexafluoro-1-butene (boiling point of 3 to 7° C.) is preferable, for example.

[Etching Gas]

The etching gas is a gas containing the fluorobutenes above. The etching gas may be a gas containing only the fluorobutenes above or may be a mixed gas containing the fluorobutenes above and a dilution gas. The etching gas may be a mixed gas containing the fluorobutenes above, a dilution gas, and an additive gas.

As the dilution gas, at least one selected from a nitrogen gas ($N_2$), helium (He), neon (Ne), argon (Ar), krypton (Kr), and xenon (Xe) is usable.

As the additive gas, an oxidizing gas, a gas of fluorocarbon, and a gas of hydrofluorocarbon are usable, for example. Specific examples of the oxidizing gas include an oxygen gas ($O_2$), ozone ($O_3$), carbon monoxide (CO), carbon dioxide ($CO_2$), nitrogen monoxide (NO), dinitrogen monoxide ($N_2O$), and nitrogen dioxide ($NO_2$). Specific examples of fluorocarbon include carbon tetrafluoride ($CF_4$), hexafluoromethane ($C_2F_6$), and octafluoropropane ($C_3F_8$). Specific examples of hydrofluorocarbon include $CF_3H$, $CF_2H_2$, $CFH_3$, $C_2F_4H_2$, $C_2F_5H$, $C_3F_7H$, $C_3F_6H_2$, $C_3F_5H_3$, $C_3F_4H_4$, and $C_3F_3H_5$. These additive gases may be used alone or in combination of two or more types.

The content of the dilution gas is preferably 90% by volume or less and more preferably 50% by volume or less based on the total amount of the etching gas. The content of the additive gas is preferably 50% by volume or less and more preferably 30% by volume or less based on the total amount of the etching gas.

From the viewpoint of improving the etching rate, the content of fluorobutene in the etching gas is preferably 5% by volume or more and more preferably 10% by volume or more based on the total amount of the etching gas. From the viewpoint of suppressing the used amount of fluorobutene, the content of fluorobutene is preferably 90% by volume or less and more preferably 80% by volume or less based on the total amount of the etching gas.

[Metal Impurities]

The etching gas according to this embodiment contains or does not contain at least one of copper, zinc, manganese, cobalt, and silicon as the metal impurities. However, when contained, the sum of the concentrations of copper, zinc, manganese, cobalt, and silicon is as low as 5000 ppb by mass or less. Therefore, the dissociation of the carbon-carbon double bond of the fluorobutene is difficult to occur, and as a result, the etching object can be selectively etched as compared with the non-etching object as described above. Herein, the "does not contain" means that copper, zinc, manganese, cobalt, and silicon cannot be quantified by an inductively coupled plasma mass spectrometer (ICP-MS).

To sufficiently exhibit the etching selectivity effect, the sum of the concentrations of copper, zinc, manganese, cobalt, and silicon contained in the etching gas needs to be 5000 ppb by mass or less and is preferably 1000 ppb by mass or less and more preferably 100 ppb by mass or less.

To prevent the dissociation of the carbon-carbon double bonds of the fluorobutenes above, the concentrations of copper, zinc, manganese, cobalt, and silicon contained in the etching gas each are preferably 1000 ppb by mass or less and more preferably 500 ppb by mass or less.

The sum of the concentrations of copper, zinc, manganese, cobalt and silicon may be 1 ppb by mass or more.

The concentrations of the metal impurities, such as copper, zinc, manganese, cobalt, and silicon, in the etching gas can be quantified by an inductively coupled plasma mass spectrometer (ICP-MS).

To achieve higher etching selectivity, not only the concentrations of copper, zinc, manganese, cobalt, and silicon in the etching gas but the concentrations of alkali metals and alkaline earth metals are preferably set to low. More specifically, in addition to the fact that the etching gas contains or does not contain at least one of copper, zinc, manganese, cobalt, and silicon as the metal impurities, and the sum of the concentrations of copper, zinc, manganese, cobalt, and silicon when contained is 5000 ppb by mass or less, it is preferable that the etching gas further contains or does not contain at least one of alkali metals and alkaline earth metals as the metal impurities, and the total sum of the concentrations of copper, zinc, manganese, cobalt, and silicon, and alkali metals and alkaline earth metals when contained is preferably 10000 ppb by mass or less, more preferably 5000 ppb by mass or less, and still more preferably 1000 ppb by mass or less.

The total sum of the concentrations of copper, zinc, manganese, cobalt, and silicon, and alkali metals and alkaline earth metals may be 2 ppb by mass or more.

Examples of alkali metals include lithium (Li), sodium (Na), potassium (K), rubidium (Rb), cesium (Cs), and francium (Fr). Examples of alkaline earth metals include beryllium (Be), magnesium (Mg), calcium (Ca), strontium (Sr), barium (Ba), and radium (Ra).

Further, to achieve higher etching selectivity, not only the concentrations of copper, zinc, manganese, cobalt, and silicon and the concentrations of alkali metals and alkaline earth metals in the etching gas but the concentrations of titanium (Ti), zirconium (Zr), hafnium (Hf), niobium (Nb), tantalum (Ta), tungsten (W), ruthenium (Ru), rhodium (Rh), palladium (Pd), platinum (Pt), silver (Ag), gold (Au), cadmium (Cd), tin (Sn), and lead (Pb) are preferably set to low.

More specifically, the etching gas contains at least one of copper, zinc, manganese, cobalt, and silicon, and at least one of alkali metals and alkaline earth metals as the metal impurities, and further contains at least one of titanium, zirconium, hafnium, niobium, tantalum, tungsten, ruthenium, rhodium, palladium, platinum, silver, gold, cadmium, tin, and lead as the metal impurities, the sum of the concentrations of all these contained metal impurities is preferably 15000 ppb by mass or less, more preferably 10000 ppb by mass or less, and still more preferably 5000 ppb by mass or less.

Further, to achieve higher etching selectivity, not only the concentrations of copper, zinc, manganese, cobalt, and silicon, the concentrations of alkali metals and alkaline earth metals, and the concentrations of titanium, zirconium, hafnium, niobium, tantalum, tungsten, ruthenium, rhodium, palladium, platinum, silver, gold, cadmium, tin, and lead in the etching gas but the concentration of chromium (Cr), molybdenum (Mo), iron (Fe), nickel (Ni), aluminum (Al), and antimony (Sb) are preferably set to low.

More specifically, when the etching gas contains at least one of copper, zinc, manganese, cobalt, and silicon, at least one of alkali metals and alkaline earth metals, and at least one of titanium, zirconium, hafnium, niobium, tantalum, tungsten, ruthenium, rhodium, palladium, platinum, silver, gold, cadmium, tin, and lead as the metal impurities, and further contains at least one of chromium, molybdenum, iron, nickel, aluminum, and antimony as the metal impurities, the sum of the concentrations of all these contained metal impurities is preferably 20000 ppb by mass or less, more preferably 15000 ppb by mass or less, and still more preferably 10000 ppb by mass or less.

The metal impurities above are contained in the etching gas in the form of simple metals, metal compounds, metal halides, or metal complexes in some cases. Examples of the form of the metal impurities in the etching gas include fine particles, liquid droplets, gas, and the like. It is considered that copper, zinc, manganese, cobalt, and silicon are derived from raw materials, catalysts, reactors, refining devices, and the like used when synthesizing the fluorobutenes above and are mixed in the etching gas.

Examples of methods for removing the metal impurities above from the fluorobutenes above (impurity removing methods employed in a metal impurity removing step) include, for example, a method for passing the fluorobutenes above through a filter, a method for bringing an adsorbent into contact with the fluorobutenes above, a method for separating the fluorobutenes above by distillation, and the like. Specifically, in a state where the fluorobutenes above are sealed in a stainless steel cylinder and held at about 0° C., a gas phase part is extracted by a method described in Examples below, so that fluorobutenes in which the concentrations of the metal impurities are reduced can be obtained, for example. It is preferable that, after reducing the sum of the concentrations of alkali metals and alkaline earth metals contained in the etching gas to 5000 ppb by mass or less by such a metal impurity removing step, an etching step described later is performed.

[Pressure Condition of Etching Step]

The pressure condition of the etching step in the etching method according to this embodiment is not particularly limited and is preferably set to 10 Pa or less and more preferably set to 5 Pa or less. When the pressure condition is within the ranges above, plasma is easily stably generated. The pressure condition in the etching step is preferably 0.05 Pa or more. When the pressure condition is within the range above, a large number of ionization ions are generated and a sufficient plasma density is easily obtained.

The flow rate of the etching gas may be set as appropriate such that the pressure inside the chamber is kept constant according to the size of a chamber and the capacity of exhaust equipment reducing the pressure inside the chamber.

[Temperature Condition of Etching Step]

The temperature condition of the etching step in the etching method according to this embodiment is not particularly limited. The temperature is set to preferably 200° C. or less to obtain high etching selectivity, more preferably 150° C. or less to suppress the etching of the non-etching object, such as a mask, and still more preferably 100° C. or less to perform anisotropic etching. Herein, the temperature of the temperature condition is the temperature of the member to be etched, but it is also possible to use the temperature of a stage installed in a chamber of an etching system and supporting the member to be etched.

The fluorobutenes above hardly react with the non-etching object, such as a mask, at temperatures equal to or less than 200° C. Therefore, when the member to be etched is etched by the etching method according to this embodiment, the etching object can be selectively etched while the non-etching object is hardly etched. Therefore, the etching method according to this embodiment can be utilized for a method for processing the etching object containing silicon into a predetermined shape utilizing the non-etching object subjected to patterning as a resist or a mask.

When the temperatures of the etching object and the non-etching object are 200° C. or less, the etching selectivity tends to increases. For example, the etching selectivity ratio which is the ratio of the etching rate of the etching object containing silicon to the etching rate of the non-etching object tends to be 10 or more.

A bias power constituting a potential difference between the plasma to be generated when performing etching and the member to be etched may be selected from 0 to 10000 W depending on a desired etching shape and is preferably about 0 to 1000 W when performing selective etching. This potential difference enables the anisotropic etching.

[Member to be Etched]

The member to be etched which is etched by the etching method according to this embodiment has the etching object and the non-etching object, but a member having a part formed of the etching object and a part formed of the non-etching object may be acceptable or a member formed of a mixture of the etching object and the non-etching object may be acceptable. The member to be etched may have something other than the etching object and the non-etching object.

The shape of the member to be etched is not particularly limited, and may be a plate shape, a foil shape, a film shape, a powder shape, or a block shape, for example. Examples of the member to be etched include the aforementioned semiconductor substrate.

[Etching Object]

The etching object may be one formed of only materials containing silicon, may be one having a part formed of only materials containing silicon and a part formed of the other materials, or may be one formed of a mixture of materials containing silicon and the other materials. Examples of the materials containing silicon include silicon oxides, silicon nitrides, polysilicon, and silicon germanium (SiGe), for example.

Examples of the silicon oxides include silicon dioxide ($SiO_2$). The silicon nitrides refer to compounds containing silicon and nitrogen in an arbitrary ratio, and $Si_3N_4$ can be mentioned as an example. The purity of the silicon nitrides is not particularly limited, and is preferably 30% by mass or more, more preferably 60% by mass or more, and still more preferably 90% by mass or more.

The shape of the etching object is not particularly limited, and may be a plate shape, a foil shape, a film shape, a powder shape, or a block shape, for example.

[Non-Etching Object]

The non-etching object does not substantially react with the fluorobutenes above or extremely slowly reacts with the fluorobutenes above, and therefore, even when the etching is performed by the etching method according to this embodiment, the etching hardly proceeds. The non-etching object is not particularly limited insofar as it has the above-described properties. Examples of the non-etching object include a photoresist, amorphous carbon, titanium nitride, metals, such as copper, nickel, and cobalt, and oxides and nitrides of these metals, for example. Among the above, a photoresist and amorphous carbon are more preferable from the viewpoint of handleability and availability.

The photoresist means a photosensitive composition having physical properties, such as solubility, changed by light or electron beams. For example, photoresists for g-line, h-line, i-line, KrF, ArF, $F_2$, EUV, and the like are mentioned. The composition of the photoresist is not particularly limited insofar as it is commonly used in a semiconductor production step. Examples thereof include compositions containing a polymer synthesized from at least one monomer selected from chain olefins, cyclic olefins, styrene, vinylphenol, acrylic acid, methacrylate, epoxy, melamine, and glycol, for example.

Further, the non-etching object is usable as a resist or a mask for suppressing the etching of the etching object by the etching gas. Therefore, the etching method according to this embodiment is usable for a method for processing the etching object into a predetermined shape (for example, processing the etching object in a film shape possessed by the member to be etched to have a predetermined film thickness) utilizing the non-etching object subjected to patterning as a resist or a mask, for example, and therefore can be suitably used for producing a semiconductor device. Further, the non-etching object is hardly etched, and therefore it is possible to suppress the etching of parts not to be etched of the semiconductor device and to prevent the loss of the properties of the semiconductor device by the etching.

The non-etching object left after the patterning can be removed by a removal method commonly used in a semiconductor device production step. For example, ashing using an oxidizing gas, such as oxygen plasma or ozone, or dissolving and removing using a chemical solution, such as APM (mixed liquid of ammonia water and hydrogen peroxide water), SPM (mixed liquid of sulfuric acid and hydrogen peroxide), or an organic solvent, is mentioned.

Next, one example of the configuration of an etching system capable of implementing the etching method according to this embodiment and one example of an etching method using the etching system are described with reference to the FIGURE. The etching system in the FIGURE is a plasma etching system performing etching using plasma. First, the etching system in the FIGURE is described.

The etching system in the FIGURE includes a chamber 10 inside which etching is performed, a plasma generation device (not illustrated) generating plasma into the chamber 10, a stage 11 supporting an etching member 12 to be etched inside the chamber 10, a thermometer 14 measuring the temperature of the member to be etched 12, an exhaust pipe 13 for exhausting gas inside the chamber 10, a vacuum pump 15 provided in the exhaust pipe 13 and reducing the pressure inside the chamber 10, and a pressure gauge 16 measuring the pressure inside the chamber 10.

The type of the plasma generating mechanism of the plasma generation device is not particularly limited, and may be one of applying a high frequency voltage to parallel plates or one of passing a high frequency current through a coil. When a high frequency voltage is applied to the member to be etched 12 in the plasma, a negative voltage is applied to the member to be etched 12, and positive ions enter the member to be etched 12 at high speed and perpendicularly, so that anisotropic etching is enabled.

The etching system of the FIGURE further includes an etching gas supply unit supplying an etching gas into the chamber 10. The etching gas supply unit includes a fluorobutene gas supply unit 1 supplying a gas of fluorobutene, a dilution gas supply unit 2 supplying a dilution gas, a fluorobutene gas supply pipe 5 connecting the fluorobutene gas supply unit 1 and the chamber 10, and a dilution gas supply pipe 6 connecting the dilution gas supply unit 2 to an intermediate part of the fluorobutene gas supply pipe 5.

The fluorobutene gas supply pipe 5 is further provided with a fluorobutene gas pressure control device 7 controlling the pressure of the fluorobutene gas and a fluorobutene gas flow rate control device 3 controlling the flow rate of the fluorobutene gas. The dilution gas supply pipe 6 is further provided with a dilution gas pressure control device 8 controlling the pressure of the dilution gas and a dilution gas flow rate control device 4 controlling the flow rate of the dilution gas. Equipment supplying an additive gas in the same manner as the dilution gas supply unit 2, the dilution gas flow rate control device 4, the dilution gas supply pipe 6, and the dilution gas pressure control device 8 may be also installed (not illustrated).

When the fluorobutene gas is supplied as the etching gas to the chamber 10, the pressure inside the chamber 10 is reduced by the vacuum pump 15, and then the fluorobutene gas is sent from the fluorobutene gas supply unit 1 to the fluorobutene gas supply pipe 5, so that the fluorobutene gas is supplied to the chamber 10 via the fluorobutene gas supply pipe 5.

When a mixed gas of the fluorobutene gas and a dilution gas, such as an inert gas, is supplied as the etching gas, the pressure inside the chamber 10 is reduced by the vacuum pump 15, and then the fluorobutene gas is sent from the fluorobutene gas supply unit 1 to the fluorobutene gas supply pipe 5 and the dilution gas is sent from the dilution gas supply unit 2 to the fluorobutene gas supply pipe 5 through the dilution gas supply pipe 6. Thus, the fluorobutene gas and the dilution gas are mixed in the intermediate part of the fluorobutene gas supply pipe 5 to form a mixed gas, and the mixed gas is supplied to the chamber 10 via the fluorobutene gas supply pipe 5.

The configurations of the fluorobutene gas supply unit 1 and the dilution gas supply unit 2 are not particularly limited and tanks, cylinders, or the like may be acceptable, for example. As the fluorobutene gas flow rate control device 3 and the dilution gas flow rate control device 4, a mass flow controller, a flow meter, and the like can be utilized, for example.

When the etching gas is supplied to the chamber 10, the etching gas is preferably supplied while the supply pressure of the etching gas (i.e., the value of the fluorobutene gas pressure control device 7 in the FIGURE) is held at a predetermined value. More specifically, the supply pressure of the etching gas is preferably set to 1 Pa or more and 0.2 MPa or less, more preferably 10 Pa or more and 0.1 MPa or less, and still more preferably 50 Pa or more and 50 kPa or less. When the supply pressure of the etching gas is within the ranges above, the etching gas is smoothly supplied to the chamber 10 and a load to the parts (for example, the various devices and pipes) possessed by the etching system illustrated in the FIGURE is small.

The pressure of the etching gas supplied into the chamber 10 is preferably 1 Pa or more and 80 kPa or less, more preferably 10 Pa or more and 50 kPa or less, and still more preferably 100 Pa or more and 20 kPa or less from the viewpoint of uniformly etching the surface of the member to be etched 12. When the pressure of the etching gas in the chamber 10 is within the ranges above, a sufficient etching rate can be obtained and the etching selectivity ratio tends to be high.

The pressure inside the chamber 10 before the etching gas is supplied is not particularly limited insofar as it is equal to or less than the supply pressure of the etching gas or less than the supply pressure of the etching gas, and is preferably $10^{-5}$ Pa or more and less than 10 kPa and more preferably 1 Pa or more and 2 kPa or less, for example.

A differential pressure between the supply pressure of the etching gas and the pressure inside the chamber 10 before the etching gas is supplied is preferably 0.5 MPa or less, more preferably 0.3 MPa or less, and still more preferably 0.1 MPa or less. When the differential pressure is within the ranges above, the etching gas is easily smoothly supplied to the chamber 10.

When the etching gas is supplied to the chamber 10, it is preferable to supply the etching gas while the temperature of the etching gas is held at a predetermined value. More specifically, the supply temperature of the etching gas is preferably 0° C. or more and 150° C. or less.

An etching treatment time (hereinafter also referred to as "etching time") can be arbitrarily set depending on how much the etching object possessed by the member to be etched 12 is desired to be etched and is preferably within 60 minutes, more preferably within 40 minutes, and still more preferably within 20 minutes considering the production efficiency of a semiconductor device producing process. The etching treatment time refers to a time during which the etching gas is brought into contact with the member to be etched 12 inside the chamber 10.

The etching method according to this embodiment can be performed using a common plasma etching system used in the semiconductor device production step, such as the etching system in the FIGURE, and the configuration of the usable etching system is not particularly limited.

For example, the positional relationship between the fluorobutene gas supply pipe 5 and the member to be etched 12 is not particularly limited insofar as the etching gas can be brought into contact with the member to be etched 12. Also with respect to the configuration of a temperature control mechanism of the chamber 10, it is sufficient when the temperature of the member to be etched 12 can be adjusted to any temperature. Therefore, a configuration may be acceptable in which the temperature control mechanism is provided directly on the stage 11 or the chamber 10 may be warmed or cooled from the outside of the chamber 10 using the temperature control mechanism externally attached.

A material of the etching system in the FIGURE is not particularly limited insofar as it has corrosion resistance to the fluorobutene to be used and can be subjected to a pressure reduction to a predetermined pressure. For example, metals, such as nickel, nickel-based alloys, aluminum, stainless steel, platinum, copper, and cobalt, ceramics, such as alumina, fluororesins, and the like are usable for portions contacting the etching gas.

Specific examples of the nickel-based alloys include Inconel (registered trademark), Hastelloy (registered trademark), Monel (registered trademark), and the like. Examples of the fluororesins include polytetrafluoroethylene (PTFE), polychlorotrifluoroethylene (PCTFE), a tetrafluoroethylene-perfluoroalkoxyethylene copolymer (PFA), polyvinylidene fluoride (PVDF), Teflon (registered trademark), Viton (registered trademark), Kalrez (registered trademark), and the like, for example.

EXAMPLES

Hereinafter, the present invention is more specifically described with reference to Examples and Comparative Examples. Fluorobutenes containing metal impurities in various concentrations were prepared. Preparation examples of the fluorobutene are described below.

Preparation Example 1

Five 1 L cylinders formed of manganese steel were prepared. These cylinders are referred to as a cylinder A, a cylinder B, a cylinder C, a cylinder D, and a cylinder E in order. The cylinder A was filled with 500 g of 1,1,1,4,4,4-hexafluoro-2-butene (boiling point: 9° C.), and then cooled to 0° C. for liquefaction, thereby forming a liquid phase part and a gas phase part at almost 100 kPa. The cylinders B, C, D, and E were reduced in pressure inside to 1 kPa or less by a vacuum pump, and then cooled to −78° C.

400 g of a gas of the 1,1,1,4,4,4-hexafluoro-2-butene was extracted from an upper outlet where the gas phase part was present of the cylinder A, and then transferred to the cylinder B in the reduced pressure state. 100 g of the 1,1,1,4,4,4-hexafluoro-2-butene left in the cylinder A was defined as a sample 1-1. Thereafter, the gas of the 1,1,1,4,4,4-hexafluoro-2-butene remaining in the cylinder A was extracted from the upper outlet, and the concentrations of various metal impurities were measured by the inductively coupled plasma mass spectrometer. Table 1 shows the results.

and then 200 g of the gas of the 1,1,1,4,4,4-hexafluoro-2-butene was extracted from an upper outlet where the gas phase part was present of the cylinder C, and then transferred to the cylinder D in the reduced pressure state. 100 g of the 1,1,1,4,4,4-hexafluoro-2-butene left in the cylinder C was defined as a sample 1-3. Thereafter, the gas of the 1,1,1,4,4,4-hexafluoro-2-butene remaining in the cylinder C was extracted from the upper outlet, and the concentrations of various metal impurities were measured by the inductively coupled plasma mass spectrometer. Table 1 shows the results.

Next, the temperature of the cylinder D was raised to about 0° C. to form a liquid phase part and a gas phase part, and then 100 g of the gas of the 1,1,1,4,4,4-hexafluoro-2-butene was extracted from an upper outlet where the gas phase part was present of the cylinder D, and then transferred to the cylinder E in the reduced pressure state. 100 g of the 1,1,1,4,4,4-hexafluoro-2-butene left in the cylinder D was defined as a sample 1-4. Thereafter, the gas of the 1,1,1,4,4,4-hexafluoro-2-butene remaining in the cylinder D was extracted from the upper outlet, and the concentrations of various metal impurities were measured by the inductively coupled plasma mass spectrometer. Table 1 shows the results.

TABLE 1

| | Concentrations of alkali metals | | Concentrations of alkaline earth metal | | | Concentrations of copper, zinc, manganese, cobalt, and silicon | | | | | |
|---|---|---|---|---|---|---|---|---|---|---|---|
| | Na | K | Mg | Ca | Total | Cu | Zn | Mn | Co | Si | Total |
| Sample 1-5 | — | — | — | — | — | 16 | 15 | 8 | 7 | 19 | 65 |
| Sample 1-4 | — | — | — | — | — | 66 | 63 | 54 | 55 | 62 | 300 |
| Sample 1-3 | — | — | — | — | — | 212 | 209 | 153 | 159 | 189 | 922 |
| Sample 1-2 | 915 | 920 | 848 | 877 | 3560 | 783 | 774 | 613 | 616 | 678 | 3464 |
| Sample 1-1 | — | — | — | — | — | 1331 | 1329 | 1206 | 1219 | 1290 | 6375 |

*) The unit of numeric values is ppb by mass.

"—" indicates that there is no measurement data.

Next, the temperature of the cylinder B was raised to about 0° C. to form a liquid phase part and a gas phase part, and then 300 g of the gas of the 1,1,1,4,4,4-hexafluoro-2-butene was extracted from an upper outlet where the gas phase part was present of the cylinder B, and then transferred to the cylinder C in the reduced pressure state. 100 g of the 1,1,1,4,4,4-hexafluoro-2-butene left in the cylinder B was defined as a sample 1-2. Thereafter, the gas of the 1,1,1,4,4,4-hexafluoro-2-butene remaining in the cylinder B was extracted from the upper outlet, and the concentrations of various metal impurities were measured by the inductively coupled plasma mass spectrometer. Table 1 shows the results.

Next, the temperature of the cylinder C was raised to about 0° C. to form a liquid phase part and a gas phase part, 100 g of the 1,1,1,4,4,4-hexafluoro-2-butene in the cylinder E was defined as a sample 1-5. The gas of the 1,1,1,4,4,4-hexafluoro-2-butene was extracted from an upper outlet where the gas phase part was present of the cylinder E, and the concentrations of various metal impurities were measured by the inductively coupled plasma mass spectrometer. Table 1 shows the results.

Preparation Example 2

Samples 2-1 to 2-5 were prepared in the same manner as in Preparation Example 1, except for using 1,1,1,2,4,4,4-heptafluoro-2-butene as fluorobutene. The concentrations of various metal impurities of each sample were measured by the inductively coupled plasma mass spectrometer. Table 2 shows the results.

TABLE 2

| | Concentrations of alkali metals | | Concentrations of alkaline earth metal | | | Concentrations of copper, zinc, manganese, cobalt, and silicon | | | | | |
|---|---|---|---|---|---|---|---|---|---|---|---|
| | Na | K | Mg | Ca | Total | Cu | Zn | Mn | Co | Si | Total |
| Sample 2-5 | — | — | — | — | — | 13 | 17 | 6 | 8 | 23 | 67 |
| Sample 2-4 | — | — | — | — | — | 64 | 61 | 52 | 56 | 59 | 292 |
| Sample 2-3 | — | — | — | — | — | 203 | 210 | 147 | 151 | 177 | 888 |
| Sample 2-2 | 913 | 905 | 822 | 856 | 3496 | 764 | 749 | 582 | 591 | 658 | 3344 |
| Sample 2-1 | — | — | — | — | — | 1297 | 1307 | 1199 | 1184 | 1248 | 6235 |

*) The unit of numeric values is ppb by mass.
"—" indicates that there is no measurement data.

Preparation Example 3

Samples 3-1 to 3-5 were prepared in the same manner as in Preparation Example 1, except for using 3,3,4,4,4-pentafluoro-1-butene as fluorobutene. The concentrations of various metal impurities of each sample were measured by the inductively coupled plasma mass spectrometer. Table 3 shows the results.

TABLE 3

| | Concentrations of alkali metals | | Concentrations of alkaline earth metal | | | Concentrations of copper, zinc, manganese, cobalt, and silicon | | | | | |
|---|---|---|---|---|---|---|---|---|---|---|---|
| | Na | K | Mg | Ca | Total | Cu | Zn | Mn | Co | Si | Total |
| Sample 3-5 | — | — | — | — | — | 14 | 18 | 8 | 7 | 19 | 66 |
| Sample 3-4 | — | — | — | — | — | 61 | 58 | 47 | 52 | 63 | 281 |
| Sample 3-3 | — | — | — | — | — | 196 | 199 | 138 | 147 | 184 | 864 |
| Sample 3-2 | 907 | 907 | 788 | 877 | 3479 | 759 | 737 | 574 | 588 | 661 | 3319 |
| Sample 3-1 | — | — | — | — | — | 1288 | 1274 | 1183 | 1197 | 1285 | 6227 |

*) The unit of numeric values is ppb by mass.
"—" indicates that there is no measurement data.

Preparation Example 4

Samples 4-1 to 4-5 were prepared in the same manner as in Preparation Example 1, except for using 2,3,3,4,4,4-hexafluoro-1-butene as fluorobutene. The concentrations of various metal impurities of each sample were measured by the inductively coupled plasma mass spectrometer. Table 4 shows the results.

TABLE 4

| | Concentrations of alkali metals | | Concentrations of alkaline earth metal | | | Concentrations of copper, zinc, manganese, cobalt, and silicon | | | | | |
|---|---|---|---|---|---|---|---|---|---|---|---|
| | Na | K | Mg | Ca | Total | Cu | Zn | Mn | Co | Si | Total |
| Sample 4-5 | — | — | — | — | — | 17 | 18 | 9 | 7 | 17 | 68 |
| Sample 4-4 | — | — | — | — | — | 65 | 61 | 47 | 48 | 59 | 280 |
| Sample 4-3 | — | — | — | — | — | 202 | 198 | 141 | 145 | 193 | 879 |

TABLE 4-continued

| | Concentrations of alkali metals | | Concentrations of alkaline earth metal | | | Concentrations of copper, zinc, manganese, cobalt, and silicon | | | | | |
|---|---|---|---|---|---|---|---|---|---|---|---|
| | Na | K | Mg | Ca | Total | Cu | Zn | Mn | Co | Si | Total |
| Sample 4-2 | 924 | 921 | 790 | 794 | 3429 | 764 | 757 | 601 | 599 | 684 | 3405 |
| Sample 4-1 | — | — | — | — | — | 1305 | 1294 | 1213 | 1203 | 1296 | 6311 |

*) The unit of numeric values is ppb by mass.
"—" indicates that there is no measurement data.

Example 1

A silicon oxide film with a thickness of 1000 nm, a silicon nitride film with a thickness of 1000 nm, and a photoresist film with a thickness of 1000 nm were individually formed on the surface of a semiconductor wafer to be exposed to the surface without lamination, and the resultant was used as a test specimen. Then, the test specimen was etched using the 1,1,1,4,4,4-hexafluoro-2-butene of the sample 1-5.

As an etching system, an ICP etching system RIE-230iP manufactured by Samco Inc., was used. Specifically, the 1,1,1,4,4,4-hexafluoro-2-butene of the sample 1-5 at a flow rate of 10 mL/min, an oxygen gas at a flow rate of 10 mL/min, and argon at a flow rate of 30 mL/min were individually and independently introduced into a chamber, an etching gas was prepared in the chamber, and a high frequency voltage was applied at 500 W to convert the etching gas into plasma in the chamber. Then, the test specimen in the chamber was etched under etching conditions of a pressure of 3 Pa, a temperature of 20° C., and a bias power of 100 W.

After the etching was completed, the test specimen was taken out from the chamber, the thicknesses of the silicon oxide film, the silicon nitride film, and the photoresist film were measured, and the thickness reduction amount from the thickness of each film before the etching was calculated. The etching rate of each film was calculated by dividing the reduction amount by the etching time. As a result, the etching rate of the photoresist film was less than 1 nm/min, the etching rate of the silicon oxide film was 64 nm/min, and the etching rate of the silicon nitride film was 57 nm/min. It was confirmed from this result that the silicon oxide film and the silicon nitride film, which are the etching objects, were selectively etched as compared with the photoresist film, which is the non-etching object.

Examples 2 to 16 and Comparative Examples 1 to 4

Table 5 shows the etching conditions and the etching results in Examples 2 to 16 and Comparative Examples 1 to 4 in comparison with Example 1. More specifically, the etching was performed under the same conditions as those in Example 1, except for the conditions shown in Table 5.

TABLE 5

| | | Etching rate (nm/min) | | |
|---|---|---|---|---|
| | | | Etching object | |
| | Sample | Non-etching object Photoresist film | Silicon oxide film | Silicon nitride film |
| Ex. 1 | Sample 1-5 | Less than 1 | 64 | 57 |
| Ex. 2 | Sample 1-4 | 2 | 66 | 60 |
| Ex. 3 | Sample 1-3 | 3 | 78 | 71 |
| Ex. 4 | Sample 1-2 | 7 | 83 | 77 |
| Comp. Ex. 1 | Sample 1-1 | 18 | 81 | 78 |
| Ex. 5 | Sample 2-5 | Less than 1 | 72 | 67 |
| Ex. 6 | Sample 2-4 | 3 | 81 | 75 |
| Ex. 7 | Sample 2-3 | 5 | 94 | 81 |
| Ex. 8 | Sample 2-2 | 8 | 87 | 83 |
| Comp. Ex. 2 | Sample 2-1 | 47 | 85 | 78 |
| Ex. 9 | Sample 3-5 | Less than 1 | 51 | 44 |
| Ex. 10 | Sample 3-4 | Less than 1 | 54 | 50 |
| Ex. 11 | Sample 3-3 | 2 | 60 | 54 |
| Ex. 12 | Sample 3-2 | 5 | 61 | 56 |
| Comp. Ex. 3 | Sample 3-1 | 13 | 61 | 54 |
| Ex. 13 | Sample 4-5 | Less than 1 | 62 | 56 |
| Ex. 14 | Sample 4-4 | Less than 1 | 71 | 59 |
| Ex. 15 | Sample 4-3 | 4 | 77 | 65 |
| Ex. 16 | Sample 4-2 | 6 | 83 | 71 |
| Comp. Ex. 4 | Sample 4-1 | 21 | 82 | 76 |

The results of Examples above show that, when the sum of the concentrations of copper, zinc, manganese, cobalt, and silicon contained in the etching gas is small, the etching object is selectively etched as compared with the non-etching object, and the etching selectivity ratio is 10 or more. On the other hand, the results of Comparative Examples above show that, when the sum of the concentrations of copper, zinc, manganese, cobalt, and silicon contained in the etching gas is large, the etching selectivity of the etching object to the non-etching object decreases, and the etching selectivity ratio is less than 10.

REFERENCE SIGNS LIST

1 fluorobutene gas supply unit
2 dilution gas supply unit
3 fluorobutene gas flow rate control device
4 dilution gas flow rate control device
5 fluorobutene gas supply pipe
6 dilution gas supply pipe
7 fluorobutene gas pressure control device
8 dilution gas pressure control device
10 chamber
11 stage
12 member to be etched
13 exhaust pipe 14 thermometer
15 vacuum pump
16 pressure gauge

The invention claimed is:

1. An etching gas comprising:
fluorobutene represented by a general formula $C_4H_xF_y$, in which x is 1 or more and 7 or less, y is 1 or more and 7 or less, and x+y is 8, wherein
the etching gas contains at least one of copper, zinc, manganese, cobalt, and silicon as metal impurities, and a sum of concentrations of copper, zinc, manganese, cobalt, and silicon is 5000 ppb by mass or less.

2. The etching gas according to claim 1, wherein
the etching gas further contains at least one of alkali metals and alkaline earth metals as the metal impurities, and
a total sum of concentrations of copper, zinc, manganese, cobalt, and silicon, and alkali metals and alkaline earth metals is 10000 ppb by mass or less.

3. The etching gas according to claim 2, wherein the alkali metal is at least one of lithium, sodium, and potassium, and the alkaline earth metal is at least one of magnesium and calcium.

4. The etching gas according to claim 3, wherein the fluorobutene is at least one selected from 1,1,1,4,4,4-hexafluoro-2-butene, 1,1,1,2,4,4,4-heptafluoro-2-butene, 3,3,4,4,4-pentafluoro-1-butene, and 2,3,3,4,4,4-hexafluoro-1-butene.

5. The etching gas according to claim 2, wherein the fluorobutene is at least one selected from 1,1,1,4,4,4-hexafluoro-2-butene, 1,1,1,2,4,4,4-heptafluoro-2-butene, 3,3,4,4,4-pentafluoro-1-butene, and 2,3,3,4,4,4-hexafluoro-1-butene.

6. The etching gas according to claim 1, wherein the fluorobutene is at least one selected from 1,1,1,4,4,4-hexafluoro-2-butene, 1,1,1,2,4,4,4-heptafluoro-2-butene, 3,3,4,4,4-pentafluoro-1-butene, and 2,3,3,4,4,4-hexafluoro-1-butene.

7. An etching method comprising:
an etching step of bringing the etching gas according to claim 1 into contact with a member to be etched having an etching object which is an object to be etched by the etching gas and a non-etching object which is not an object to be etched by the etching gas, and selectively etching the etching object as compared with the non-etching object, wherein
the etching object contains silicon.

8. The etching method according to claim 7, comprising:
before the etching step, a metal impurity removing step of setting the sum of the concentrations of copper, zinc, manganese, cobalt, and silicon contained in the etching gas to 5000 ppb by mass or less.

9. The etching method according to claim 8, wherein the etching gas is a gas containing only the fluorobutene or a mixed gas containing the fluorobutene and a dilution gas.

10. The etching method according to claim 7, wherein the etching gas is a gas containing only the fluorobutene or a mixed gas containing the fluorobutene and a dilution gas.

11. The etching method according to claim 10, wherein the dilution gas is at least one selected from a nitrogen gas, helium, argon, neon, krypton, and xenon.

12. A method for producing a semiconductor device using the etching method according to claim 8,
the member to be etched being a semiconductor substrate having the etching object and the non-etching object, and the method comprising:
a treatment step of removing at least a part of the etching object from the semiconductor substrate by the etching.

13. A method for producing a semiconductor device using the etching method according to claim 5,
the member to be etched being a semiconductor substrate having the etching object and the non-etching object, and the method comprising:
a treatment step of removing at least a part of the etching object from the semiconductor substrate by the etching.

14. An etching method comprising:
an etching step of bringing the etching gas according to claim 2 into contact with a member to be etched having an etching object which is an object to be etched by the etching gas and a non-etching object which is not an object to be etched by the etching gas, and selectively etching the etching object as compared with the non-etching object, wherein
the etching object contains silicon.

15. An etching method comprising:
an etching step of bringing the etching gas according to claim 3 into contact with a member to be etched having an etching object which is an object to be etched by the etching gas and a non-etching object which is not an object to be etched by the etching gas, and selectively etching the etching object as compared with the non-etching object, wherein
the etching object contains silicon.

16. An etching method comprising:
an etching step of bringing the etching gas according to claim 4 into contact with a member to be etched having an etching object which is an object to be etched by the etching gas and a non-etching object which is not an object to be etched by the etching gas, and selectively etching the etching object as compared with the non-etching object, wherein
the etching object contains silicon.

17. A method for producing a semiconductor device using the etching method according to claim 6,
the member to be etched being a semiconductor substrate having the etching object and the non-etching object, and the method comprising:
a treatment step of removing at least a part of the etching object from the semiconductor substrate by the etching.

18. A method for producing a semiconductor device using the etching method according to claim 7,
the member to be etched being a semiconductor substrate having the etching object and the non-etching object, and the method comprising:
a treatment step of removing at least a part of the etching object from the semiconductor substrate by the etching.

* * * * *